United States Patent [19]
Kurita et al.

[11] Patent Number: 5,289,116
[45] Date of Patent: Feb. 22, 1994

[54] APPARATUS AND METHOD FOR TESTING ELECTRONIC DEVICES

[75] Inventors: Jun Kurita, Kokubunji; Kiyoyasu Hiwada, Yamato; Nobuyuki Kasuga; Yoichiro Yamada, both of Hachioji; Shigeru Kuwano, Hino; Keita Gunji, Hachioji; Tomoya Yamazaki, Hino, all of Japan

[73] Assignee: Hewlett Packard Company, Palo Alto, Calif.

[21] Appl. No.: 952,469

[22] Filed: Sep. 28, 1992

Related U.S. Application Data

[63] Continuation of Ser. No. 707,844, May 30, 1991, abandoned.

[30] Foreign Application Priority Data

| May 31, 1990 | [JP] | Japan | 2-143638 |
| May 31, 1990 | [JP] | Japan | 2-143639 |
| May 31, 1990 | [JP] | Japan | 2-143640 |
| May 31, 1990 | [JP] | Japan | 2-143641 |

[51] Int. Cl.$^5$ .................................. G01R 31/28
[52] U.S. Cl. .................... 324/158 R; 324/73.1; 371/15.1
[58] Field of Search ............. 324/73.1, 158 R, 158 F; 371/27, 61, 25.1, 15.1; 437/8; 364/580

[56] References Cited

U.S. PATENT DOCUMENTS

| 4,125,763 | 11/1978 | Drabing et al. | 371/27 |
| 4,216,539 | 8/1980 | Raymond et al. | |
| 4,517,661 | 5/1985 | Graf et al. | 371/27 |
| 4,656,632 | 4/1987 | Jackson | 371/27 |
| 4,696,005 | 9/1987 | Millham et al. | 371/27 |
| 4,806,852 | 2/1989 | Swan et al. | 371/27 |
| 4,816,750 | 3/1989 | Van der Kloot et al. | 371/27 |
| 4,849,702 | 7/1989 | West et al. | 371/27 |
| 4,864,574 | 9/1989 | Pritt | 371/61 |
| 5,032,789 | 7/1991 | Firooz et al. | 324/158 R |
| 5,034,686 | 7/1991 | Aspelin | 324/158 R |
| 5,095,262 | 3/1992 | Henley et al. | 371/27 |

Primary Examiner—Vinh Nguyen
Attorney, Agent, or Firm—Woodcock Washburn Kurtz Mackiewicz & Norris

[57] ABSTRACT

An apparatus 1 for testing mixed signal electronic devices (i.e., devices, such as LSI devices, whose input/output signals include direct current signals, digital signals and analog signals, where the time relationship between the various input and output signals may be either synchronous or asynchronous) includes a master clock subsystem (MCLK-SS) 11, a subsystem group comprised of a digital master subsystem (DM-SS) 12, a digital slave subsystem (DS-SS) 13, a waveform generator subsystem (WG-SS) 14, a waveform digitizer subsystem (WD-SS) 15, a time measuring module (TMM) 16, and a direct current subsystem (DC-SS) 17, and an interfacing test head 18. The MCLK-SS 11 receives a master clock from a timing generator 21 or DSP 23 of the device under test (DUT) 186 and generates a first master clock MCLK1 and a second master clock MCLK2, each of which is synchronized with the master clock from the DUT. A reference clock generator 111, which receives the output of the buffer 181, supplies a standard clock to the first and second clock generators 112, 113, which in turn generate the first and second master clock signals.

17 Claims, 4 Drawing Sheets

APPARATUS AND METHOD FOR TESTING ELECTRONIC DEVICES

This is a continuation, of application Ser. No. 707,844, filed May 30, 1991, now abandoned.

FIELD OF THE INVENTION

The present invention generally relates to apparatuses for testing electronic devices, and more particularly relates to an apparatus and method for testing a mixed signal device.

BACKGROUND OF THE INVENTION

The advanced state of the art of electronic devices is apparent from the diversity of the functions and good performance of such devices, particularly in view of their small size. The state of the art is typified by large scale integrated circuit devices (LSIs). The preferred embodiment of the present invention is especially suited for testing LSIs. An LSI or other device being tested is referred to herein as the device under test, or DUT. The invention can also be used for testing smaller scale integrated circuits and individual parts such as transistors, FETs, resistors, capacitors, inductors, etc.

A feature of modern LSI technology is that components that used to be peripheral circuits of such LSIs are now incorporated into the LSIs to expand their function and increase their speed. As a result, input/output signals of LSIs include direct current (DC) signals, digital signals and analog signals. The time relationship between the various input and output signals may be either synchronous or asynchronous, and their signal modulation speed may be greater than 100 MHz. These input/output signals are referred to as the mixed signal in the description of the preferred embodiment.

Conventional LSI testing devices are often realized by extending known IC testing devices or following the concept of known IC testing devices; as a consequence, testing of LSIs has involved dividing the LSIs into individual functional blocks. For example, for a functional block dealing with digital signals, a test similar to that performed by a digital IC tester has been used and for a functional block dealing with analog signals a test similar to that of an analog IC tester has been used. An LSI that passed all functional block tests was judged to be a conforming article. Such a "divide and govern" test methodology may be effective in a case where each functional block is highly independent, but when the blocks are somewhat interdependent, which is the case with recent LSIs, that methodology cannot adequately test how the DUT would perform in an actual use environment.

For example, one cannot evaluate the performance of a high speed analog/digital converter (ADC) in an actual use environment by just evaluating its DC input/output characteristics. The relationships between the input signal frequency and the conversion error and the input waveform and the conversion error, and the mutual relationship between the input waveform and the conversion clock and the conversion error, are characteristics that should be determined for an actual environment.

Moreover, in an interface IC for communications, while input/output is carried out asynchronously, data is input/output from/to a synchronous digital circuit and sometimes the input/output signals include analog signals.

A digital filter also contains analog input and output circuits and an internal digital circuit which are connected via an ADC and a digital/analog converter (DAC). In this case, characteristics of the transfer function that depend on the relationship between input signals and an internal clock, noises and spurious characteristics have to be evaluated.

Moreover, when an LSI on which a feed-back circuit should be externally equipped is tested, a control input has to be calculated and supplied immediately after measuring and evaluating an output signal; e.g., when an excessive input is detected in an ADC, the attenuation of a pre-attenuator must be increased.

Another problem with prior art testers is that calculation speed decreases when the outputs of individual pins are mathematically combined and the calculation result is used for evaluation. For example, in a tester wherein each signal generating and signal measuring module, or a signal generating and signal measuring shared module (hereinafter simply referred to as a GM module), and a signal processing module are connected through the intermediary of a memory, the processes of storing data into the memory, calculating results, storing results and outputting results are carried out, making it difficult to make calculations in parallel. Moreover, communications between the GM module and signal processing module must rely on the intermediary of a host processor or on sequential communications of a signal processor, which slows the operating speed of the tester and causes the programs for such procedures to become extremely complicated.

Accordingly, a goal of the present invention is to provide a testing apparatus for testing electronic devices that have mixed input and output signals, thus simulating an actual use environment of such devices.

SUMMARY OF THE INVENTION

The present invention encompasses apparatuses and methods for for testing mixed signal electronic devices. An apparatus in accordance with the present invention comprises test head means for sending/receiving test signals to/from a device under test (DUT); master clock means for receiving at least one signal from the DUT and for generating at least two master clock signals synchronized to the signal received; digital master means for sending preprogrammed digital signal patterns to the DUT in synchronism to at least one of the master clock signals; digital signal means for measuring digital signals from the DUT in synchronism to at least one of the master clock signals; waveform generator means for sending analog signals to the DUT in synchronism to at least one of the master clock signals; waveform digitizer means for measuring analog signals from the DUT in synchronism to at least one of the master clock signals; and direct current means for measuring direct current characteristics of the DUT by sending/receiving direct current signals to/from the DUT in synchronism to at least one of the master clock signals.

A specific embodiment of the invention may further comprise control means for providing test sequences for testing a DUT to the digital master means, digital signal means, waveform generator means, waveform digitizer means and direct current means.

The master clock means may comprise means for generating a first clock signal at a first frequency $f_1$ and a second clock signal at a second frequency $f_2$, wherein the ratio $f_1/f_2$ is a rational number.

The digital master means, digital signal means, waveform generator means, waveform digitizer means and direct current means may each comprise sequencer means for conducting test sequences without intervention of the control means after the test sequences are received from the control means.

Moreover, the master means, digital signal means, waveform generator means, and waveform digitizer means may comprise digital signal processing means for performing calculations on their inputs and/or outputs. The respective digital signal processing means may be coupled together such that they are capable of performing calculations at an enhanced speed.

A specific embodiment may also comprise time measuring means for measuring the timing of output signals of a DUT.

The sequencer of the digital master means may include means for controlling the other sequencers.

A specific embodiment may still further comprise means for conducting a test sequence once per the least common multiple of the respective periods of the master clock signals.

According to a preferred embodiment of the present invention, which embodiment is described in detail below, the sequencer for controlling the GM module is hierarchically structured so that a long test sequence can be executed without the intermediary of a central processing unit. The hierarchical structure permits the amount of wiring to the GM module to be reduced by having the module controlled by a lowest order sequencer; i.e., the amount of information to be transmitted by the wiring can be reduced because several sequencers are provided with a memory for storing an established sequence. Moreover, the preferred embodiment is capable of synchronizing all the sequencers and the GM module to the same clock source and is further capable of synchronizing desired input/output signals of a DUT.

When the sequencers and the GM module are associated with a plurality of clock sources, no waiting time or sequence turbulence is generated because the preferred embodiments are capable of changing sequences within one effective minimum clock by using a local coincidence of their waveforms. The tester performs pseudo asynchronous control by setting the frequencies of the clock sources such that the ratio of their frequencies is a rational number.

The use of a digital signal processor (DSP) together with controlling the GM module with the sequencers enables the adoption of a structure whereby complex local processing of signals of each pin of the DUT becomes possible. Signals from the GM module are preprocessed by the DSP and fed back to a host sequencer or the central processing unit. It is also possible to process interactively at high speeds because the DSPs have their own bus and can be programmed to communicate with each other. Communications and computational processing accompanying communications of the DSP are performed by synchronizing to the same clock source as that used for the sequencers and the GM module, so that their outputs and operations are predictable and their reproducibility is assured. Accordingly, it is possible to simulate a stable and accurate actual environment of the DUT. An especial feature of the tester is that real-time testing can be readily implemented.

The present invention encompasses methods that comprise the steps of sending test signals to a DUT; receiving at least one signal from the DUT and generating at least two master clock signals synchronized to the signal received; sending preprogrammed digital signal patterns to the DUT in synchronism to at least one of the master clock signals; measuring digital signals received from the DUT in synchronism to at least one of the master clock signals; sending analog signals to the DUT in synchronism to at least one of the master clock signals; measuring analog signals received from the DUT in synchronism to at least one of the master clock signals; and measuring direct current characteristics of the DUT by sending/receiving direct current signals to/from the DUT in synchronism to at least one of the master clock signals.

DETAILED DESCRIPTION OF THE PREFERRED EMBODIMENT

Figure 1:
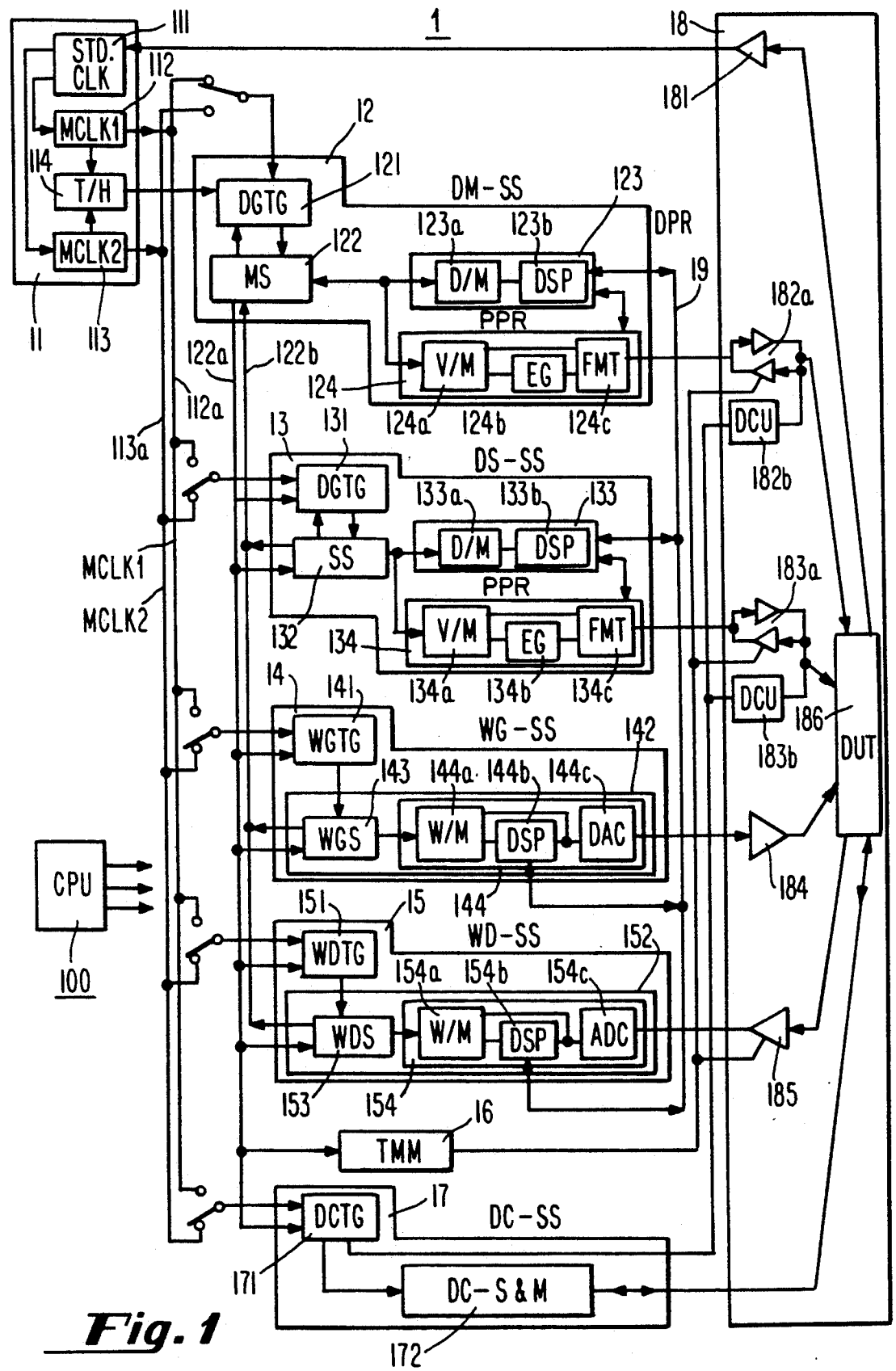
FIG. 1 is a block diagram of one embodiment an electronic device testing apparatus according to the present invention.
Figure 2:
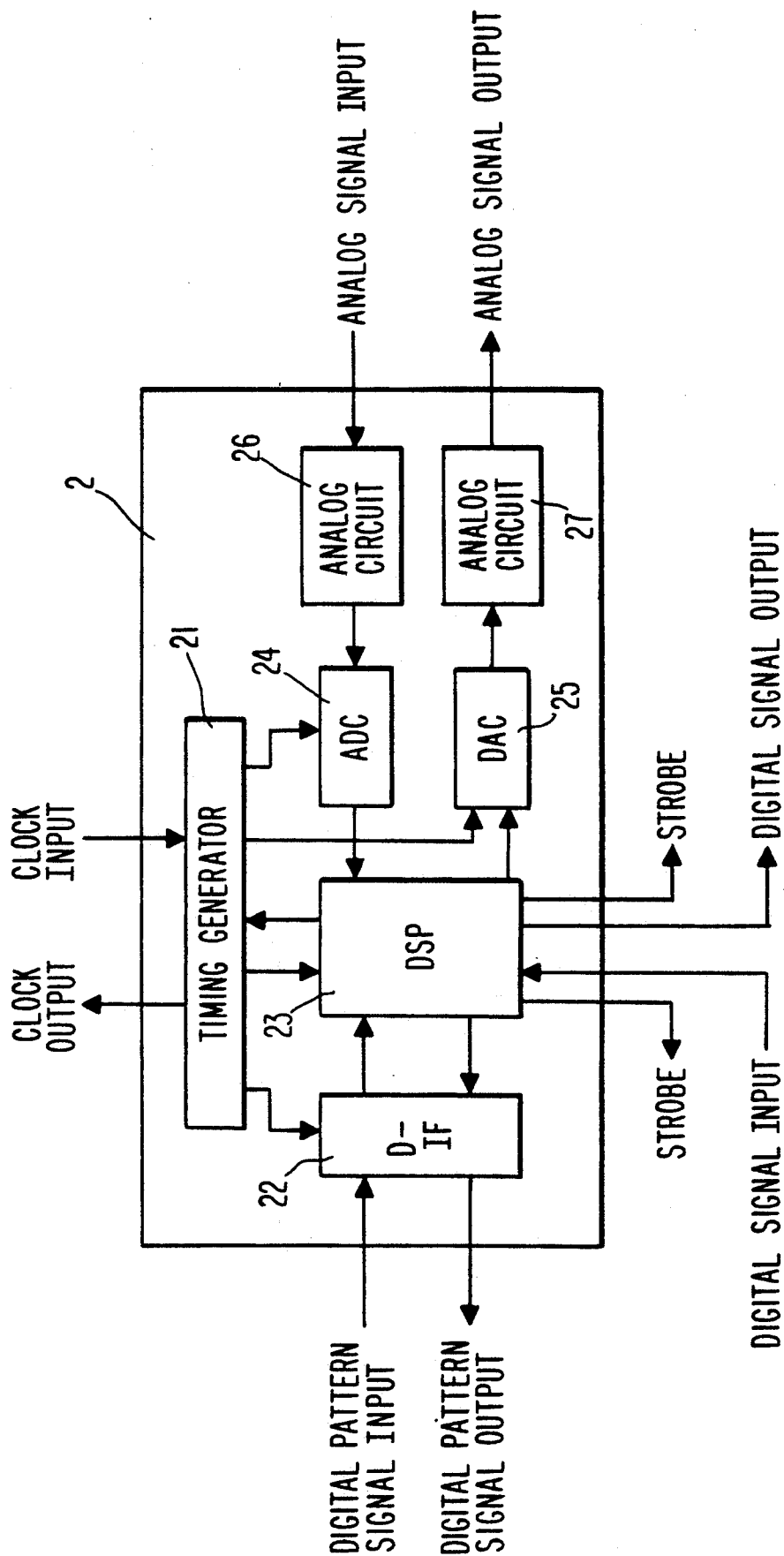
FIG. 2 is a functional block diagram of a generalized model of an electronic device.

FIG. 1 is a block diagram of a testing apparatus 1 (hereinafter the tester) according to the present invention and FIG. 2 is a functional block diagram of a generalized model 2 of DUT 186 of FIG. 1. The generalized model 2 is a general purpose model of a mixed signal electronic device (or DUT); however devices lacking a particular functional block(s) are still appropriate as a DUT.

Referring to FIG. 2, generalized model 2 comprises a timing generator 21, which performs inputting/outputting of clock signals and internal timing control; an interface 22 (referred to as the D-IF) of digital patterns; an analog circuit 26; an analog/digital converter (ADC) 24, which receives, normalizes and digitizes analog signals; a digital/analog converter (DAC) 25, which analogizes digital signals (i.e., converts digital signals to analog signals); a digital signal processing unit (DSP) 23; and another analog circuit 27, which performs input/output and processing of digital signals.

FIG. 1 shows the structure of the tester 1. Tester 1 is similar to a Hewlett Packard model HP9480A analog LSI test system, but improved in that it is capable of testing mixed signal devices. Each component represented by a rectangular shape is implemented in hardware in the preferred embodiment. However, it is also possible to implement those components in software, although software implementations are not preferred since they generally result in a loss of speed. The tester 1 is programmed by the central processing unit (CPU) 100. When a test sequence (TS) is programmed by the CPU 100 and necessary micro programs are input to sequencers 122, 132, 143, 153, etc.; the test is conducted by the master sequencer (MS) 122 independently from the central processing unit 100. Each subsystem 12, 13, 14, 15 and 17 and a time measuring module (TMM) 16 operate by synchronizing to a clock signal supplied from a master clock subsystem (MCLK-SS) 11.

The following table of reference numerals will be helpful in following the remaining description of the preferred embodiment:

11: Master clock subsystem (MCLK-SS)
111: Reference clock generator
112: Master clock 1

112a: MCLKI bus
113: Master clock 2
113a: MCLK2 bus
114: Timing handler (T/H)
(Blocks 111-113 are similar to HP8664A and HP8660A frequency synthesizers, which are available from Hewlett Packard Co.)
12: Digital master subsystem (DM-SS)
121: Digital timing generator (DGTG) (DGTG 121 is similar to an HP8175A digital signal generator.)
122: Master sequencer (MS)
122a: Control line
122b: Control line
123: Data processing resource (DPR)
123a: Data memory (D/M)
123b: DSP
124: Per pin resource (PPR)
124a: Vector memory (V/M) 124a
124b: Edge generator (EG)
124c: Formatter (FMT)
(DM-SS 12, without DGTG 121, D/M 123a and DSP 123b, is functionally equivalent to an HP82000 IC evaluation system.)
13: Digital slave subsystem (DS-SS)
131: Digital timing generator (DGTG 131 is similar to an HP8175A digital signal generator.)
132: Slave sequencer (SS)
133: Data processing resource
133a: Data memory
133b: DSP
134: Per pin resource
134a: Vector memory
134b: Edge generator
134c: Formatter
(DS-SS 13, Without DGTG 131, D/M 133a and DSP 133b, is functionally equivalent to an HP82000 IC evaluation system.)
14: Waveform generator subsystem (WG-SS)
141: Waveform generator timing generator (WGTG 141 is similar to an HP8175A digital signal generator.)
142: Per channel resource
143: Waveform generator sequencer (WGS) (WGS 143 is similar to SS 132.)
144: Per pin resource
144a: Waveform memory (W/M)
144b: DSP
144c: Digital/analog converter
(PCR 142, without DSP 144b, is similar to an HP8770A arbitrary waveform synthesizer.)
15: Waveform digitizer subsystem (WD-SS)
151: Waveform digitizer timing generator
(Block 151 is similar to an HP8175A digital signal generator.)
152: Per channel resource
153: Waveform digitizer sequencer (WDS) (WDS 153 is similar to SS 132.)
154: Per pin resource (Block 154 is similar to an HP54500 digitizing oscilloscope.)
154a: Waveform memory
154b: DSP
154c: Analog/digital converter (ADC)
16: Time measuring module (TMM) (TMM 16 is similar to an HP5345A electronic counter.)
17: Direct current subsystem (DC-SS)
171: Timing generator (This block is similar to an HP8175A digital signal generator.)
172: DC Stimulus and Measurement (DC S & M 172 is similar to an HP4062A semiconductor parametric test system.)
18: Test head (Test head 18 is similar to the test head used in the HP9480A test system.)
181: Buffer
182a: Pin driver
182b: DC unit
183a: Pin driver
183b: DC unit
184: Output amplifier
185: Input amplifier
19: Shared data path
100: Central processing unit (CPU 100 may be selected from the HP9000 series of computers and operated with the HP-UX operating system.)
186: Device under test
(DSPs 123b, 133b, 144b and 154b may be a Motorola DSP96002 or Texas Instruments TMS320C30 DSP.)

The tester 1 contains the MCLK-SS 11, the subsystem group (comprised of a digital master subsystem (DM-SS) 12, a digital slave subsystem (DS-SS) 13, a waveform generator subsystem (WG-SS) 14, a waveform digitizer subsystem (WD-SS) 15, a time measuring module (TMM) 16, and a direct current subsystem (DC-SS) 17), and an interfacing test head 18. The MCLK-SS 11 receives a master clock signal from the timing generator 21 or the DSP 23 of the DUT 186 (see FIG. 2) through the intermediary of a buffer 181 and generates a first master clock MCLK1 and a second master clock MCLK2, each of which is synchronized with the master clock from the DUT. A reference clock generator 111, which receives the output of the buffer 181, supplies a standard clock to the first and second clock generators 112, 113, which in turn generate the first and second master clock signals. Of course, a reference clock may still be generated when no DUT master clock exists or when the DUT master clock is not used or when the reference clock generator 111 is synchronized by other signals. It is preferable for the ratio of the clock frequencies of MCKL1 112 and MCLK2 113 to be a set to rational number.

A timing handler 114 detects a coincidence of signal transitions of the MCLK1 and MCLK2 clock signals and generates a signal for controlling the master sequence of the tester 1, i.e., for controlling the master sequencer (MS) 122. When a test sequence is started, an uncertainty in the coincidence is about 1 ns in one embodiment of the present invention.

Generally the DUT 186 is controlled by means of digital patterns and digital signals, therefore the tester 1, which has a structure complementary to the DUT 186, is provided with the DM-SS 12, which supplies signals to the digital functional blocks to define the test sequence. The DM-SS 12 comprises a digital timing generator (DGTG) 121, the master sequencer (MS) 122, which outputs a test sequence timed and programmed by the DGTG 121, and a prior art DM-SS per pin resource (PPR) 124, which is controlled by the MS 122 and which comprises a vector memory (V/M) 124a, an edge generator (EG) 124b and a formatter (FMT) 124c, and which generates digital signals for pins of the DUT 186. An output of the DM-SS 12 is input to the DUT 186 through the intermediary of a pin driver 182a.

The DM-SS further comprises a data processing resource (DPR) 123. The DPR 123 comprises a DSP 123b and a data memory (D/M) 123a in which data computed by the DSP 123b is stored. The DPR 123 is capable of processing a test vector of the Vector memory 124a and of changing the output of the PPR 124. Moreover, the DSP 123b is capable of communicating with other subsystems (e.g., DSP 133b of DS-SS 13) and inputting/outputting data. The operation of the DPR 123 is controlled by the master sequencer 122.

The DS-SS 13 has a structure similar to that of the DM-SS 12, except that the master sequencer 122 is replaced by a slave sequencer (SS) 132. A DGTG 131, the slave sequencer 132, a DPR 133, a PPR 134, a data memory 133a, a DSP 133b, a vector memory 134a, EG 134b, a FMT 134c and a pin driver 183a perform operations similar to the operations performed by the DGTG 121, the master sequencer 122, the DPR 123, the PPR 124, the data memory 123a, the vector memory 124a, the EG 124b, the FMT 124c and the pin driver 182a, respectively.

The WG-SS 14 generates arbitrary waveforms by a known method, but it contains a DSP 144b and can output computed, stored waveforms. The WG-SS 14 also contains a waveform generating section 144 that outputs waveforms following a waveform generator sequencer (WGS) 143 timed by a timing generator (WGTG) 141. Together units 143 and 144 (144 comprises 144a, b and c) constitute a per channel resource (PCR) 142 that is adapted for the desired number of channels of the tester 1.

The waveform generating section 144 is capable of generating waveforms either by the prior art method, which uses a waveform memory 144a and a DAC 144c (which converts digital outputs of the waveform memory 144a to analog waveforms), or by the method of the present invention, whereby waveforms stored in the waveform memory 144a are processed by a DSP 144b and then sent to the DAC 144c. Outputs of the WG-SS 14 are provided to pins of the DUT 186 via an output amplifier 184.

The WD-SS 15 performs an operation that is the opposite to the operation performed by WG-SS 14. It receives signals from an output pin of the DUT 186 through the intermediary of an input amplifier 185 and, after digitizing the received signal with an ADC 154c, processes the digital signal with a DSP 154b and stores the processed signal in a waveform memory 154a. This operation is controlled by a digitizer sequencer (WDS) 153. Blocks 153 and 154 constitute a PCR 152 that is prepared for the number of channels desired. Timing control of the digitizer sequencer 153 is performed by a timing generator 151.

Measurements of the timing of each output of the DUT 186 is performed by the prior art timer module 16. Timer control is performed by the master sequencer 122.

The DC-SS 17 is controlled by a timing generator 171 that is controlled by the master sequencer 122. The direct current characteristics of the DUT 186 are measured by DC units 182b and 183b of each digital input-/output pin of DUT 186 and a stimulus and measurement unit 172 for analog signals. Although DC measurements have been asynchronously performed by a central processing unit 100 in the past, they are synchronously performed by the master sequencer 122 in the preferred embodiment of the present invention. The stability and reliability of tests are thereby improved because tests of a DUT 186 whose input and output signals are analog signals and whose internal operations include digital signal processing are carried out in sync with a digital signal.

The clock supplied to each timing generator (DGTG 121, DGTG 131, WGTG 141, WDTG 151, DCTG 171) is selected from either the MCLK1 112 or the MCLK2 113 signal by the central processing unit 100. Even if the master clock differs among subsystems, the control signal of the master sequencer 122 (which is clocked by the timing handler 114) enables all of the subsystems to be controlled concurrently. Moreover, pseudo asynchronous operation can be achieved by setting MCLK1 and MCLK2 to different frequencies.

Control signals of the master sequencer 122 are introduced to the timing generators 131, 141, 151, 171 and slave sequencers 132, 143, 153 via a control line 122a and sequence block (SBK) instructions are sent to those subsystems.

The following is an example of an SBK: Instructions are given to the DS-SS 13 to generate a series of digital patterns and digital signals, to the WG-SS 14 to generate a series of waveforms, to the WD-SS 15 to sample a series of waveforms, to the time measuring module 16 and to the DC-SS 17 to set and measure a series of voltages and currents. Following the instructions, the subsystems perform timing generation and sequence generation within the SBKs following internal micro programs and synchronizing to a master clock.

At the ends of sub-sequences, DSP results and evaluation results for output waveforms of the DUT 186 are immediately fed back to the master sequencer 122 via signal line 122b.

Decision and change functions are realized and their speed is increased with hardware so that responses to instructions from the CPU 100, evaluations of signals fed back and changes of test sequences (program branching) can be accomplished within one cycle of the master clock. This operational pattern is also used when a sequence block of a subsystem is executed upon a sequence change due to a calculation result of the DSP. That is, the master sequencer 122 and the slave sequencers 132, 143 and 153 execute a sequence stored previously by the CPU 100 and perform a master-slave operation. Changing sequences is executed within one clock cycle, so that no "dead time" is created.

Figure 3A:
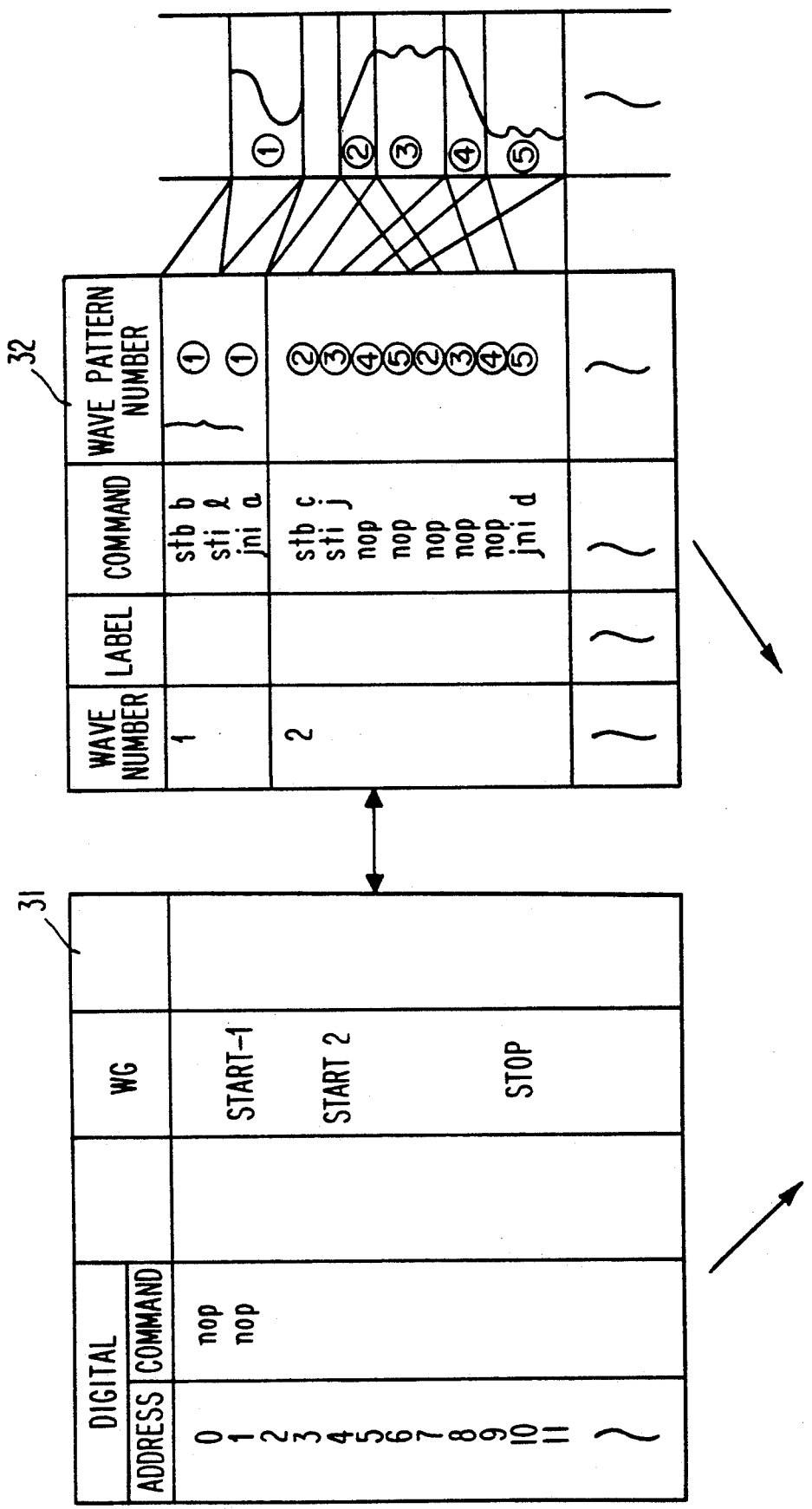
FIGS. 3A and 3B illustrate examples of waveforms generated by the apparatus of FIG. 1.
Figure 3B:
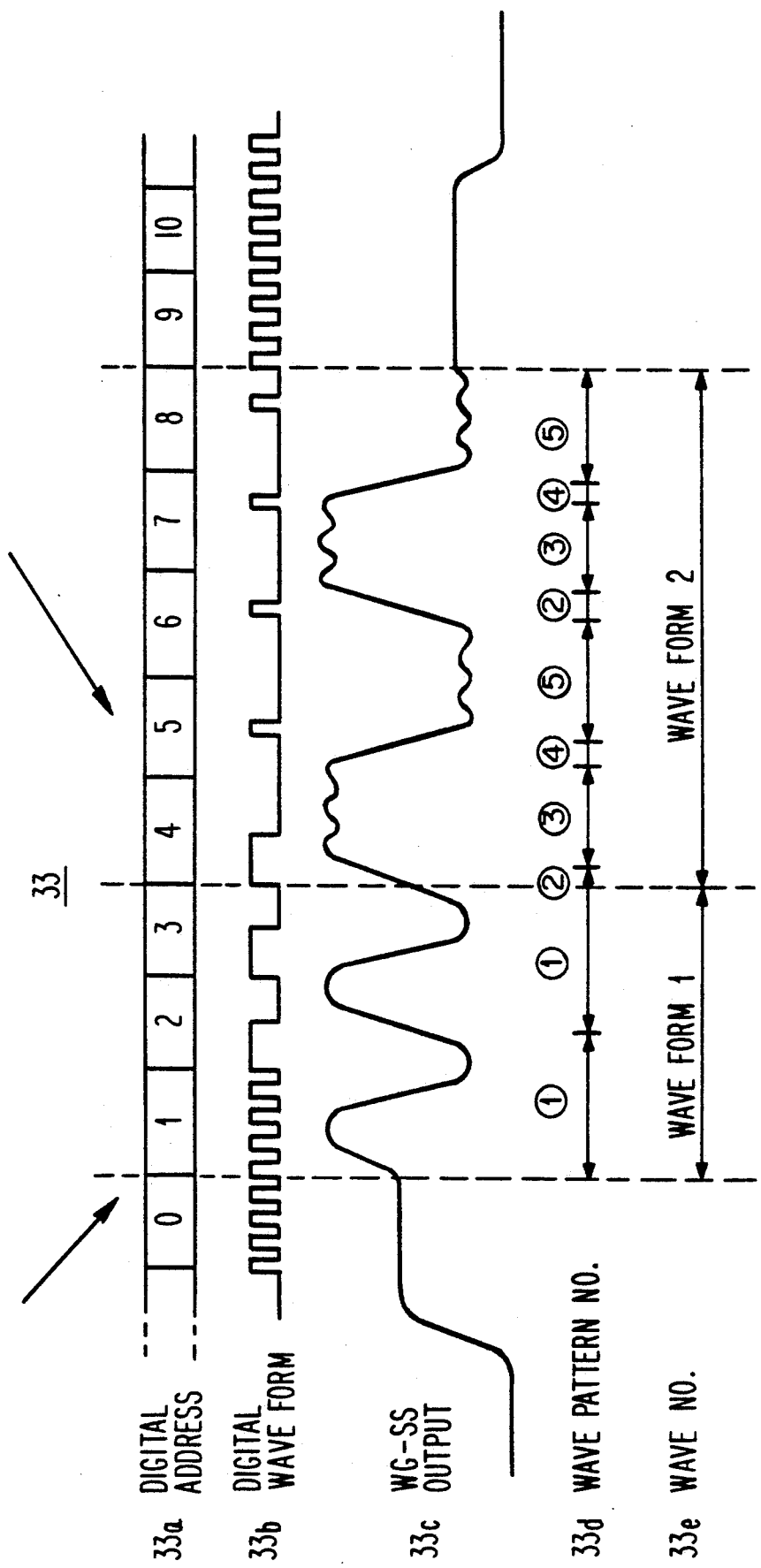

FIGS. 3A and 3B illustrate the relationship between exemplary waveforms of the waveform generator subsystem 14 and waveforms of DM-SS 12 or DS-SS 13.

Programs 31, 32 are software tables that indicate a master sequence and a slave sequence and examples of actual waveforms are shown in an actual waveform group 33. Line 33a of FIG. 3B represents vector addresses of the DM-SS 12 or the DS-SS 13 and 33b depicts a wave form of vectors corresponding to the vector addresses. When the sequence blocks from the master sequencer 122 are waveforms 1 and 2, the waveform generator sequencer generates waveform pieces 1, 2, 3, 4 and 5 to synthesize the waveform 1, 2 defined by the SBKs. The waveform depicted on line 33c is an output of the WG-SS 14. Lines 33d and 33e show the corresponding waveform pieces and waveform numbers used. Thus, waveforms with no dead time and in sync with digital vectors are generated.

DSPs 123b, 133b, 144b and 154b will now be described. The respective functions of those DSPs within the subsystems have already been described. The DSPs are capable of communicating with each other through a shared data path 19 independently of the CPU 100. They also perform data transmission/reception to/from the CPU 100. Their control instructions are transferred from the CPU 100 beforehand and their operations are started by the synchronized signals of the sequencers of each subsystem. The DSPs execute input, computation and output of data following control commands. Connection of the DSPs to the data path 19 is also carried out via control commands or directly by the CPU 100. For example, by connecting DSP 154b and DSP 144b to the data path 19 and sending signals therebetween, measured results in the WD-SS 15 can be immediately fed back to the WS-SS 14 to change waveforms.

Parallel processing by the DSPs increases the processing speed approximately proportionally to the number of parallel processors. For example, the average output signal of each DUT pin may be found simultaneously.

Moreover, it is possible to increase processing speed when a waveform is sampled at N points to perform Fourier conversion. It is possible to increase the final conversion rate while reducing the sampling rate of each channel by connecting a plurality of channels of the WD-SS 15 in parallel. When $N=L\times M$ and when discrete Fourier conversion (a DFT) of L points is computed in parallel M times, multiplication of (multiplication number of L-point DFT)$\times M+(M-1)\times(N/2)$ necessary. In addition, the number of multiplications required for an L-point DFT is $L^2$ when an FFT is not used and $(L/2)\log_2(L)$ when an FFT is used and L is a power of 2. Accordingly, if M is set to 2 or 4, the number of multiplications will be $(N/2)\log_2(N)$ or $(N/2)\log_2(N)+(N/2)$. When distributed processing is performed by 2 or 4 DSPs, the number of multiplications per unit is decreased.

The slave sequencers in the subsystems are structured so as to specify a starting address of the micro program to activate SBKs that have been clock-synchronized using a decoder and an index register synchronized to the clock. Accordingly, multiple branching can be performed within one clock cycle following instructions from the master sequencer and no dead time due to the branching is introduced in the waveforms. The tester 1 uses clock frequencies of 64–128 MHz for MCLK1 and MCLK2.

The following advantages can be obtained by employing the present invention:

1. The central processing unit only decodes and instructs execution of a test program and does not affect the progress of the test. Accordingly, the tester is not affected by the load on the central processing unit, enabling the tester to simulate an actual environment of the DUT.

2. The stability, legibility and repeatability of measurements of DC characteristics, which have been controlled and asynchronously operated by the central processing unit in the past, improve because they are clocked and executed by a master sequencer synchronized with other signals of the DUT.

3. The accuracy and reliability of evaluations of functional blocks of a mixed signal device are improved and testing time is shortened because the blocks are evaluated in parallel in an environment closer to an actual use environment of the device, regardless of whether the functional blocks are analog, digital, synchronous or asynchronous.

4. All of the subsystems are clocked by a synchronized master clock and the operations ("next operation" and "which operation") are prescribed in the subsystems, so that a test program can be created in a high level language.

5. No dead time is produced in operations of the subsystems because multiple branching and activation of the sequencers are performed within one clock cycle by a synchronized decoder and an index register.

6. Wiring between hardware components is reduced because a multiple sequencer structure is employed.

7. Independent and parallel operations can be performed while maintaining good stability and repeatability because the multiple sequencers are all synchronized.

8. A synchronous and non-synchronous mixed signal DUT can be integrally tested by synchronizing each subsystem using a plurality of clocks synchronized to the clock of the DUT and by enabling a pseudo asynchronous operation using the frequency differences between a plurality of clocks.

9. Each subsystem or channel has a local DSP, by which signals can be processed in parallel and the speed of the whole test can be increased.

10. Local DSPs can communicate with each other and can process and control a plurality of DUT pin signals independently from the central processing unit, so that a complex input/output environment can be accurately clocked.

The true scope of the present invention is not limited to the specific embodiment described above. For example, in a particular embodiment the arrangement the subsystems may be modified and that embodiment would still fall within the scope of the following claims.

What is claimed:

1. An apparatus for testing mixed signal electronic devices, comprising:
   (a) test head means for sending/receiving test signals to/from a device under test (DUT);
   (b) master clock means, coupled to said test head means, for receiving at least one signal from said DUT, for generating a first master clock signal at a first frequency $f_1$ and a second master clock signal at a second frequency $f_2$, wherein the ratio $f_1/f_2$ is a rational number and is selected to simulate an asynchronous operation of the DUT, and said first and second master clock signals are synchronized to the signal received from the DUT, and including timing handler means for detecting a coincidence of signal transitions of said master clock signals and generating a coincidence signal indicative of said coincidence;
   (c) digital master means, coupled to said test head means and said master clock means, for sending preprogrammed digital signal patterns to said DUT in synchronism to a selected one of said master clock signals or a selected combination of said master clock signals;
   (d) digital signal means, coupled to said test head means, for measuring digital signals from said DUT in synchronism to a selected one of said master clock signals or a selected combination of said master clock signals;
   (e) waveform generator means, coupled to said test head means, for sending analog signals to said DUT in synchronism to a selected one of said master clock signals or a selected combination of said master clock signals;
   (f) waveform digitizer means, coupled to said test head means, for measuring analog signals from said DUT in synchronism to a selected one of said master clock signals or a selected combination of said master clock signals; and (g) direct current means, coupled to said test head means, for measuring direct current characteristics of said DUT by sending/receiving direct current signals to/from said DUT in synchronism to a selected one of said master clock signals or a selected combination of said master clock signals.

2. The apparatus recited in claim 1, further comprising:
   (h) control means for providing test sequences for testing the DUT to the digital master means, digital signal means, waveform generator means, waveform digitizer means and direct current means.

3. The apparatus of claim 2, wherein said digital master means, digital signal means, waveform generator means, waveform digitizer means and direct current means each further comprises sequencer means for conducting test sequences without intervention of said control means after said sequences are received from said control means; and the sequencer means in said digital master means includes means for controlling the other sequencers, and is responsive to said coincidence signal to change the sequences of the other sequencers within one clock cycle.

4. The apparatus recited in claim 3, wherein at least two of said means (c)–(f) further comprise digital signal processing means for performing calculations on their inputs and/or outputs.

5. The apparatus recited in claim 4, wherein said digital signal processing means are coupled together such that they are capable of performing calculations at an enhanced speed.

6. The apparatus recited in claim 1, further comprising time measuring means for measuring the timing of output signals of the DUT.

7. The apparatus recited in claim 2, further comprising means for conducting a test sequence once per the least common multiple of the respective periods of said master clock signals.

8. A method for testing mixed signal electronic devices, comprising the steps of:
   (a) sending test signals to a device under test (DUT);
   (b) receiving at least one signal from said DUT and generating at least two master clock signals synchronized to the signal received, including generating a first master clock signal at a first frequency $f_1$ and a second master clock signal at a second frequency $f_2$, wherein the ratio $f_1/f_2$ is a rational number and is selected to simulate an asynchronous operation of the DUT, and detecting a coincidence of signal transitions of said master clock signals and generating a coincidence signal indicative of said coincidence;
   (c) sending preprogrammed digital signal patterns to said DUT in synchronism to at least one of said master clock signals;
   (d) measuring digital signals received from said DUT in synchronism to at least one of said master clock signals;
   (e) sending analog signals to said DUT in synchronism to at least one of said master clock signals;
   (f) measuring analog signals received from said DUT in synchronism to at least one of said master clock signals; and
   (g) measuring direct current characteristics of said DUT by sending/receiving direct current signals to/from said DUT in synchronism to at least one of said master clock signals;

wherein steps (c)–(g) are preformed in accordance with predetermined sequences, and the sequences are changed within one clock cycle in response to said coincidence signal.

9. The method recited in claim 8, further comprising the step of performing, in parallel, at least two digital signal processing calculations on at least two signals received from the DUT.

10. The method recited in claim 8, further comprising the step of measuring the timing of output signals of the DUT.

11. The method recited in claim 8, further comprising conducting a test sequence once per the least common multiple of the respective periods of said master clock signals.

12. An apparatus for testing mixed signal electronic devices, comprising:
   (a) test head means for sending/receiving test signals to/from a device under test (DUT);
   (b) master clock means, coupled to said test head means, for receiving at least one signal from said DUT, for generating a first master clock signal at a first frequency $f_1$ and a second master clock signal at a second frequency $f_2$, wherein the ratio $f_1/f_2$ is a rational number and said first and second master clock signals are synchronized to the signal received from the DUT, and including timing handler means for detecting a coincidence of signal transitions of said master clock signals and generating a coincidence signal indicative of said coincidence;
   (c) digital master means, coupled to said test head means and said master clock means, for sending preprogrammed digital signal patterns to said DUT in synchronism to a selected one of said master clock signals or a selected combination of said master clock signals;
   (d) digital signal means, coupled to said test head means, for measuring digital signals from said DUT in synchronism to a selected one of said master clock signals or a selected combination of said master clock signals;
   (e) waveform generator means, coupled to said test head means, for sending analog signals to said DUT in synchronism to a selected one of said master clock signals or a selected combination of said master clock signals;
   (f) waveform digitizer means, coupled to said test head means, for measuring analog signals from said DUT in synchronism to a selected one of said master clock signals or a selected combination of said master clock signals;
   (g) direct current means, coupled to said test head means, for measuring direct current characteristics of said DUT by sending/receiving direct current signals to/from said DUT in synchronism to a selected one of said master clock signals or a selected combination of said master clock signals; and
   (h) control means for providing test sequences for testing the DUT to the digital master means, digital signal means, waveform generator means, waveform digitizer means and direct current means,
   wherein said digital master means, digital signal means, waveform generator means, waveform digitizer means, and direct current means each further comprises sequencer means for conducting test sequences without intervention of said control means after said sequences are received from said control means; and wherein the sequencer means in said digital master means includes means for controlling the other sequencer means, and is responsive to said coincidence signal to change the sequences of the other sequencer means within one clock cycle.

13. The apparatus of claim 12, further comprising means for conducting a test sequence once per the least common multiple of the respective periods of said master clock signals.

14. The apparatus of claim 13, wherein the ratio $f_1/f_2$ is selected to simulate an asynchronous operation of the DUT.

15. The apparatus of claim 14, wherein at least two of said means (c)–(f) further comprise digital signal processing means for performing calculations on their inputs and/or outputs.

16. The apparatus of claim 15, wherein said digital signal processing means are coupled together such that they are capable of performing calculations at an enhanced speed.

17. The apparatus of claim 16, further comprising time measuring means for measuring the timing of output signals of the DUT.

* * * * *